United States Patent
Kroener

(10) Patent No.: US 9,337,311 B2
(45) Date of Patent: May 10, 2016

(54) ELECTRONIC COMPONENT, A SEMICONDUCTOR WAFER AND A METHOD FOR PRODUCING AN ELECTRONIC COMPONENT

(71) Applicant: Infineon Technologies AG, Neubiberg (DE)

(72) Inventor: Friedrich Kroener, Villach (AT)

(73) Assignee: Infineon Technologies AG, Neubiberg (DE)

( * ) Notice: Subject to any disclaimer, the term of this patent is extended or adjusted under 35 U.S.C. 154(b) by 133 days.

(21) Appl. No.: 14/225,652

(22) Filed: Mar. 26, 2014

(65) Prior Publication Data

US 2014/0206163 A1    Jul. 24, 2014

Related U.S. Application Data

(62) Division of application No. 12/245,900, filed on Oct. 6, 2008, now Pat. No. 8,710,665.

(51) Int. Cl.
| | |
|---|---|
| H01L 21/762 | (2006.01) |
| H01L 21/763 | (2006.01) |
| H01L 29/66 | (2006.01) |
| H01L 29/06 | (2006.01) |
| H01L 29/739 | (2006.01) |
| H01L 29/78 | (2006.01) |
| H01L 23/00 | (2006.01) |
| H01L 29/08 | (2006.01) |

(Continued)

(52) U.S. Cl.
CPC ...... *H01L 29/66712* (2013.01); *H01L 29/0657* (2013.01); *H01L 29/7395* (2013.01); *H01L 29/7802* (2013.01); *H01L 29/7809* (2013.01); *H01L 24/32* (2013.01); *H01L 24/33* (2013.01); *H01L 29/0873* (2013.01); *H01L 29/0878* (2013.01); *H01L 29/0886* (2013.01); *H01L 29/41741* (2013.01); *H01L 29/456* (2013.01); *H01L 2224/291* (2013.01); *H01L 2224/32238* (2013.01); *H01L 2924/01079* (2013.01); *H01L 2924/13055* (2013.01); *H01L 2924/13091* (2013.01)

(58) Field of Classification Search
CPC .............................................. H01L 21/823431
See application file for complete search history.

(56) References Cited

U.S. PATENT DOCUMENTS

| | | | |
|---|---|---|---|
| 4,022,641 | A | 5/1977 | Lindberg |
| 4,348,253 | A | 9/1982 | Subbarao et al. |

(Continued)

FOREIGN PATENT DOCUMENTS

| | | |
|---|---|---|
| DE | 40 35 628 | 5/1992 |
| EP | 0461316 | 12/1991 |
| WO | 0178144 | 10/2001 |

OTHER PUBLICATIONS

Office Action mailed Mar. 4, 2010 in U.S. Appl. No. 12/245,900.

(Continued)

*Primary Examiner* — Mohammad Choudhry
(74) *Attorney, Agent, or Firm* — Dicke, Billig & Czaja, PLLC

(57) ABSTRACT

An electronic component includes a semiconductor substrate defined by a generally planar first face, a generally planar second face and side faces extending between the generally planar second face and the generally planar first face. The semiconductor substrate has a curved contour between the generally planar second face and the side faces.

16 Claims, 5 Drawing Sheets

(51) Int. Cl.
    *H01L 29/417*    (2006.01)
    *H01L 29/45*     (2006.01)

(56) References Cited

U.S. PATENT DOCUMENTS

| | | | |
|---|---|---|---|
| 5,356,829 | A | 10/1994 | Willman |
| 5,465,009 | A | 11/1995 | Drabik et al. |
| 5,637,922 | A | 6/1997 | Fillion et al. |
| 5,705,848 | A | 1/1998 | Bayerer |
| 5,795,793 | A | 8/1998 | Kinzer |
| 6,084,284 | A * | 7/2000 | Adamic, Jr. ......... H01L 21/2007 257/347 |
| 6,133,634 | A | 10/2000 | Joshi |
| 6,291,315 | B1 | 9/2001 | Nakayama et al. |
| 6,306,680 | B1 | 10/2001 | Fillion et al. |
| 6,649,974 | B2 | 11/2003 | Werner et al. |
| 7,122,887 | B2 | 10/2006 | Standing et al. |
| 7,271,470 | B1 | 9/2007 | Otremba |
| 7,371,693 | B2 | 5/2008 | Suzuki |
| 2001/0016369 | A1 | 8/2001 | Zandman et al. |
| 2001/0045619 | A1* | 11/2001 | Dekker ............... H01L 21/8222 257/566 |
| 2001/0048116 | A1 | 12/2001 | Standing et al. |
| 2002/0027276 | A1 | 3/2002 | Sakamoto et al. |
| 2002/0038890 | A1 | 4/2002 | Ohuchi |
| 2002/0096349 | A1 | 7/2002 | Hedler et al. |
| 2003/0038342 | A1 | 2/2003 | Standing |
| 2003/0137040 | A1 | 7/2003 | Standing |
| 2004/0021216 | A1 | 2/2004 | Hosoya |
| 2004/0038509 | A1 | 2/2004 | Standing et al. |
| 2004/0084770 | A1 | 5/2004 | Skocki |
| 2004/0113236 | A1 | 6/2004 | Kurita et al. |
| 2004/0185642 | A1* | 9/2004 | Rueb ..................... H01L 21/263 438/514 |
| 2004/0224438 | A1 | 11/2004 | Standing et al. |
| 2005/0077596 | A1 | 4/2005 | Bauer et al. |
| 2005/0104165 | A1 | 5/2005 | Ishio et al. |
| 2005/0121795 | A1 | 6/2005 | Mauder |
| 2006/0087026 | A1 | 4/2006 | Cao et al. |
| 2006/0248716 | A1 | 11/2006 | Weidner et al. |
| 2007/0248786 | A1 | 10/2007 | Kuo |
| 2007/0290337 | A1 | 12/2007 | Otremba et al. |

OTHER PUBLICATIONS

Office Action mailed Sep. 7, 2010 in U.S. Appl. No. 12/245,900.
Office Action mailed Mar. 28, 2013 in U.S. Appl. No. 12/245,900.
Final Office Action mailed Nov. 8, 2011 in U.S. Appl. No. 12/245,900.
Ku, New Developments in KOH Etching Technique, Limits in Miniaturisation of Bulk Micro-machined Capacitive Accelerometers, 1996, pp. 103-144.

* cited by examiner

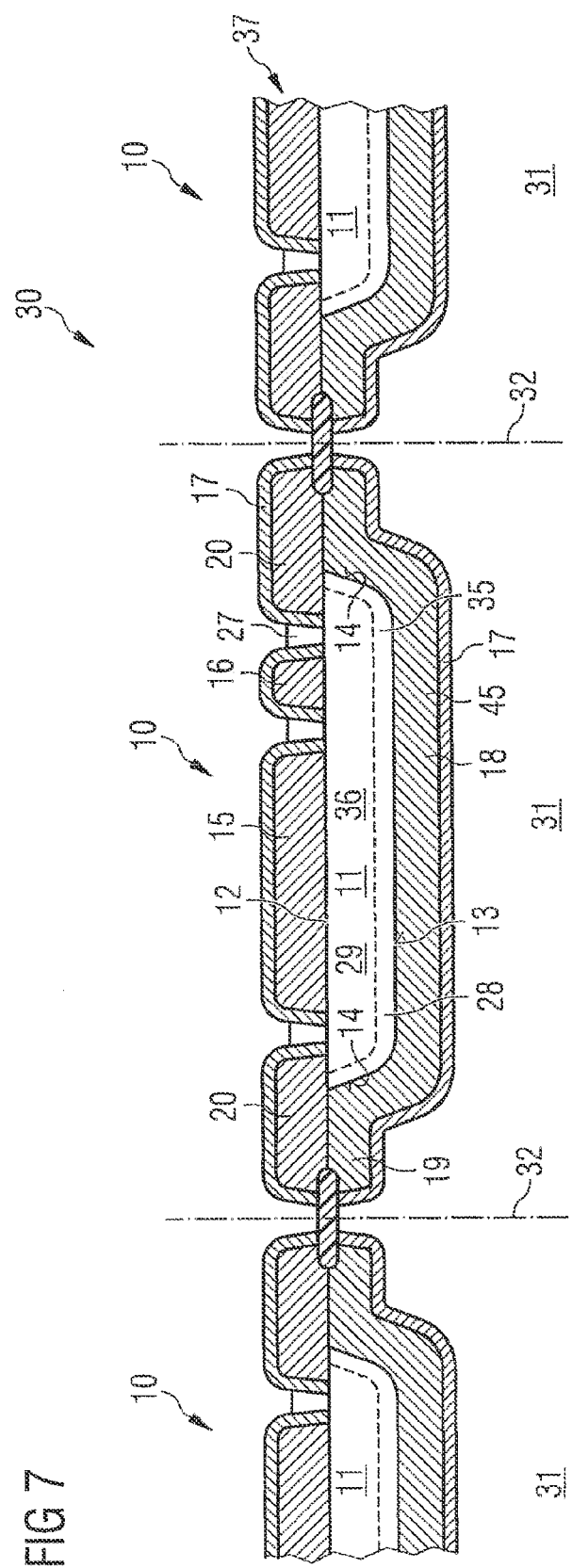

ELECTRONIC COMPONENT, A SEMICONDUCTOR WAFER AND A METHOD FOR PRODUCING AN ELECTRONIC COMPONENT

CROSS-REFERENCE TO RELATED APPLICATIONS

This Utility Patent Application is a Divisional application of U.S. Ser. No. 12/245,900, filed Oct. 6, 2008, which is incorporated herein by reference.

BACKGROUND

An electronic component may include a semiconductor substrate such as a semiconductor chip including doped regions of a first conductivity type or a second conductivity type complementary to the first conductivity type which are arranged to provide a desired device. For example, the semiconductor chip may provide an MOS-controlled transistor such as a vertical MOSFET or a vertical IGBT.

At least one surface of the semiconductor chip further includes a metallization structure which provides a rewiring structure between the doped regions within the semiconductor substrate and contact areas on the surface of the chip. Further connections such as bond wires may be attached to these contact areas on the surface of the chip to enable an external power supply to be applied to the semiconductor chip and signals to be sent from the semiconductor chip.

SUMMARY

An electronic component includes a semiconductor substrate defined by a generally planar first face, a generally planar second face and side faces extending between the generally planar second face and the generally planar first face. The semiconductor substrate further includes a curved contour between the generally planar second face and the side faces.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 7 illustrates the deposition of a finishing layer onto the metallization layer.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
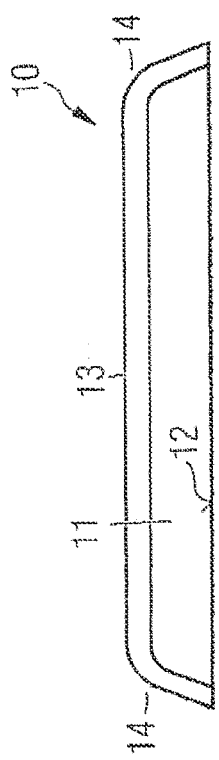
FIGS. 1a and 1b illustrate an electronic component according to an embodiment.
Figure 1B:
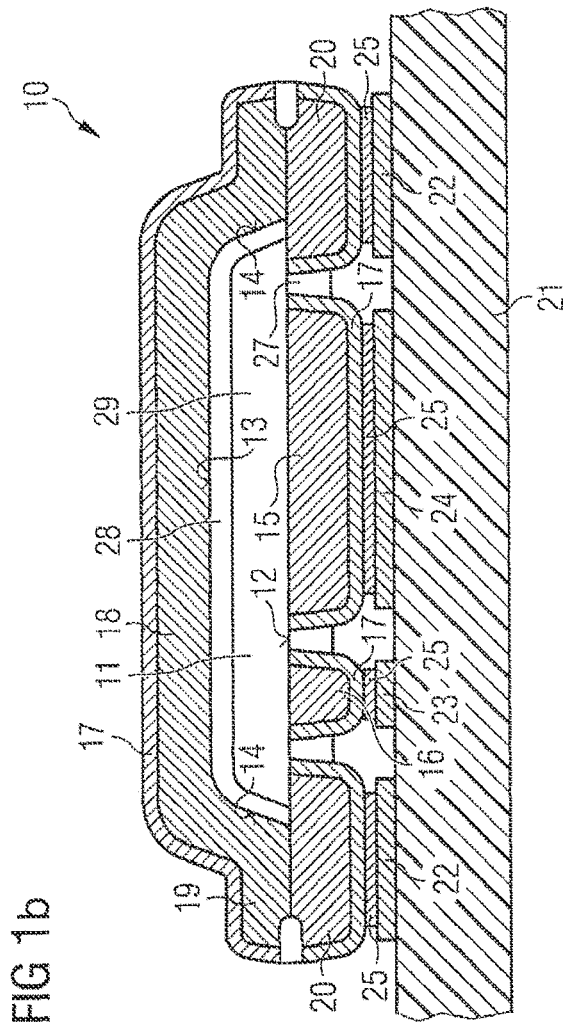
Figure 2:
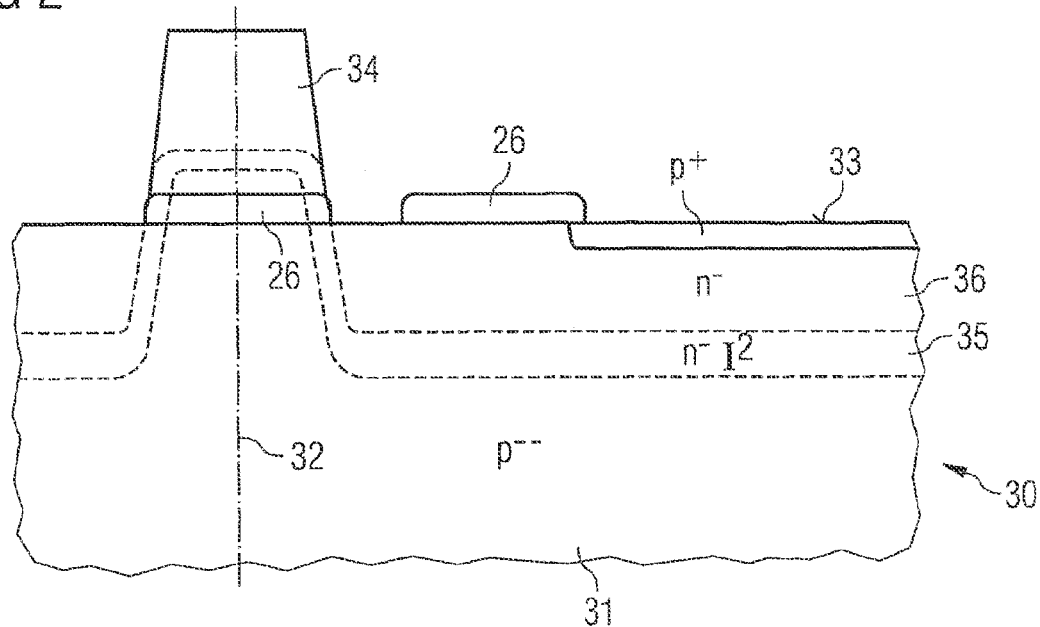
FIG. 2 illustrates the production of a highly-doped layer of a first conductivity type within a semiconductor substrate of a second conductivity type.

FIGS. 1a and 1b illustrate an electronic component 10 according to an embodiment. In particular, the electronic component 10 includes a semiconductor substrate 11 having a first face 12 which is generally planar, a second face 13 which is generally planar and side faces 14 extending between the first face 12 and second face 13. In this embodiment, the semiconductor substrate 11 includes silicon.

The side faces 14 flare outwardly from the second face 13 so that the first face 12 has an area which is greater than the area of the second face 13. The semiconductor substrate 11 includes a curved contour between the second face 13 and the side faces 14. In plan view, the semiconductor substrate 11 is generally square.

As defined herein, a curved contour is used to exclude an edge as may be formed by singulating the semiconductor substrate from the wafer by sawing or by anisotropic or isotropic etching of silicon. The curved contour may have a diffusion profile.

In this embodiment, the semiconductor substrate 11 provides a vertical MOSFET device. The first face 12 includes a large area source contact 15 and a smaller area gate contact 16 which are spaced, and electrically isolated, from one another. The source contact 15 and gate contact 16 include copper and a further outer gold layer 17.

The second face 13 and side faces 14 of the semiconductor substrate 11 are encapsulated by a copper layer 18 which also includes a thin gold outer gold layer 17. The copper layer 18 extends to the first face 12 and outwardly from the side faces 14 providing peripheral regions 19. The peripheral regions 19 are positioned on peripheral regions of a drain contact 20.

The drain contact 20 is partly arranged on the first face 12 of the semiconductor substrate 11 and extends outwardly from the side faces 14 of the semiconductor substrate 11. The peripheral region 19 of the copper layer 18 are positioned directly on the peripheral regions of the drain contact 20.

The drain contact 20 has a generally square ring-shaped form since the copper layer 18 is arranged on all the side faces 14 of the semiconductor substrate 11. The drain contact 20 includes copper and an outer gold layer 17 and has a thickness similar to that of the source contact 15 and a contact 16 so that these contacts are arranged generally coplanar with one another enabling the electronic component 10 to be surface mounted on a substrate 21 such as a circuit board.

This embodiment, the rewiring board 21 includes contact areas 22, 23 and 24 on a first surface having dimensions and an arrangement corresponding to the source contact 15, gate contact 16 and drain contact 20 of the electronic component 10. In this embodiment, the electronic component 10 is attached to the contact areas 22, 23 and 24 of the rewiring board 21 by soft solder connections 25.

In this embodiment, the first face 12 further includes a dielectric 27 in the form of a structured layer of epoxy resin which is positioned between the source contact 15, gate contact 16 and drain contact 20.

The semiconductor substrate 11 includes a peripheral layer 28 of a first conductivity type which extends along the second face 13 and side faces 14 and bounds a central region 29 also of the first conductivity type. The peripheral layer 28 is more highly doped than the central region 29. The peripheral layer 28 has a first thickness adjacent the second face 13 and a second thickness adjacent the side faces 14. The first thickness is greater than the second thickness. The peripheral layer 28 has the form of a well with a curved contour between the base and side walls. The peripheral layer 28 provides the drain region of the vertical MOSFET device.

FIGS. 2 to 7 illustrate the manufacture of an electronic component 10 according to an embodiment. FIGS. 2 to 6 illustrate a section of a semiconductor wafer 30 which is used to the manufacture a plurality of electronic components 10, in particular, a plurality of vertical MOSFET power transistors. The silicon wafer 30 includes a plurality of component positions 31 arranged in rows and columns and separated from their immediate neighbors by a sawing line whose position is indicated in the figure by reference number 32. An edge portion of a single component position 31 is illustrated in FIGS. 2 to 6.

The silicon wafer 30 of the second conductivity type, in this embodiment p, is provided. A highly doped well of the second conductivity type is introduced into the first major surface 33 of the silicon wafer 30 to provide a source region. Gate and source regions are provided in further non-illustrated portions of the silicon wafer 30 in the region of the first major surface 33. A field oxide layer 26 is applied to the first face 12 and structured to provide oxide regions arranged between the singulation trench 32 and the source region. A region of the first face 12 adjacent the singulation trench 32 is exposed from the field oxide layer 26.

A structured photo resist mask 34 is applied to the first major surface 33 along the singulation lines 32. A deep n implantation is carried out to provide a highly-doped n buried well shaped layer 35, denoted n-I2 in the drawing, bounding a lightly doped n central region 36 in the lightly-doped p silicon wafer 30 in each of the chip positions 31. The highly-doped buried layer 35 has side regions which extend to the first major surface 33 and has a general well-shape having a thickness. The highly-doped layer 35 can be implanted by using protons followed by annealing. In other embodiments, a combination of empty sites and electron donors are provided. The photo resist mask 34 is then removed.

In a further non illustrated embodiment, phosphorous is implanted into the lightly-doped p wafer at a high energy to form the highly doped buried layer and then activated at a high temperature. Afterwards, the p well, gate and source doping are carried out at temperatures sufficiently low to prevent excessive diffusion of the buried layer.

Figure 3:
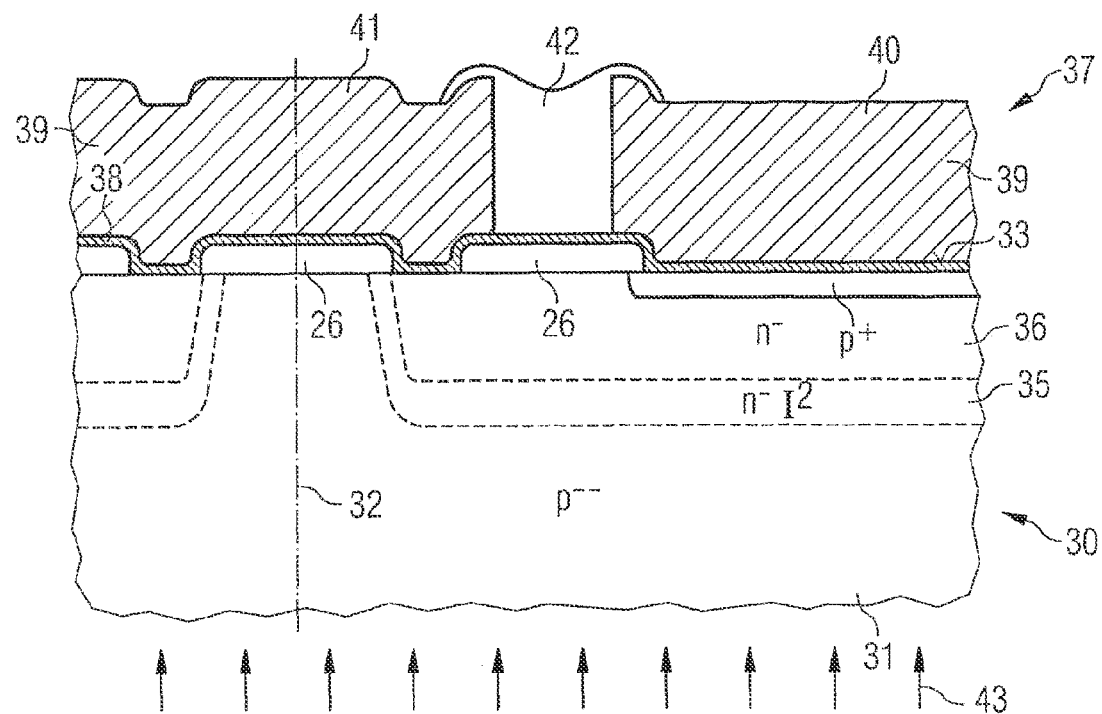
FIG. 3 illustrates the production of a metallization layer on a first surface of the semiconductor substrate and the etching of a second surface of the semiconductor substrate.

FIG. 3 illustrates the formation of structured metallization layer 37 on the first major surface 33 by sputtering a seed layer 38 on the first major surface 33 and electro-depositing a thicker copper layer 39 to form a source contact 40 and drain contact 41 as well as a non-illustrated gate contact on the first major surface 33 of the semiconductor wafer 30. The drain contact 41, source contact 40 and non-illustrated gate contact are spaced from one another and electrically isolated from one another by using an epoxy rein 42. The epoxy resin 42 also provides additional mechanical support.

In other embodiments, the epoxy is not used.

The lightly doped p region of the semiconductor wafer 30 is removed by anodic etching as is indicated schematically in FIG. 3 by arrows 43. Anodic etching makes use of the differing etch rate of silicon depending on the conductivity type and/or the doping level. This enables the selective removal of regions of one conductivity type over regions of the complementary conductivity type. A suitable etch is KOH. The drain contact 41 is used as the anode in the electrochemical cell used in the following anodic etching process.

As an alternative, a wet acid anodizing etch process may be performed to remove the p-doped region of the semiconductor wafer 30.

Figure 4:
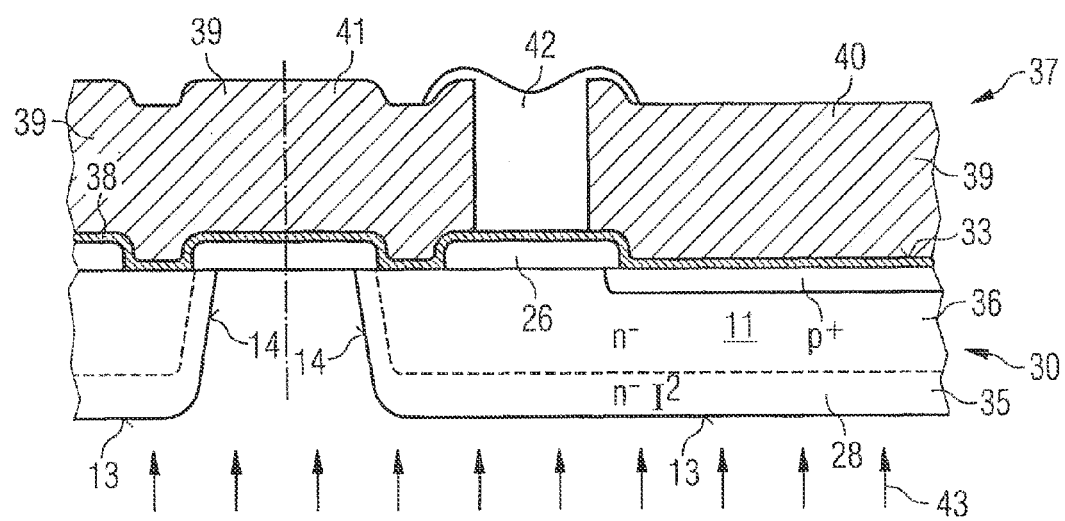
FIG. 4 illustrates the etching the second surface of the semiconductor substrate to reveal the highly doped layer.

FIG. 4 illustrates that the etching is carried out until the buried layer 35 is exposed. Due to the much lower etch rate of the n-doped silicon compared to the p-doped silicon, etching effectively stops when the highly-doped n region is exposed. Therefore, the outermost surface of the highly-doped n layer provides the outermost second face 13 and side faces 14 of the semiconductor substrate 11 in each component position 31.

The silicon substrate 11 of each electronic component is the separated from its neighbors in the semiconductor wafer 30 due to the removal of the p-doped silicon positioned in the singulation regions. The oxide region 26 positioned in the singulation trench is also removed exposing the metallization layer 37 providing the drain contact 41. The semiconductor substrates 11 are held in a wafer form by the metallization layer 37.

The semiconductor substrates 11 have a curved contour between the second face 13 which is generally planar and the side faces 14. The form of the curve may be adjusted by adjusting the implantation and diffusion used to produce the highly-doped buried layer 35 in each of the component positions 31 of the wafer 30. The curved contour has a diffusion-type contour.

The depth of the buried layer 35 from the first major surface 33 of the semiconductor wafer 30 generally defines the thickness of the semiconductor substrate 11 since the outermost surfaces 13, 14 of the semiconductor substrate 11 are provided by the buried layer 35 once it is exposed. In an embodiment, the semiconductor substrate 11 has a thickness of around 10 μm (micron).

Figure 5:
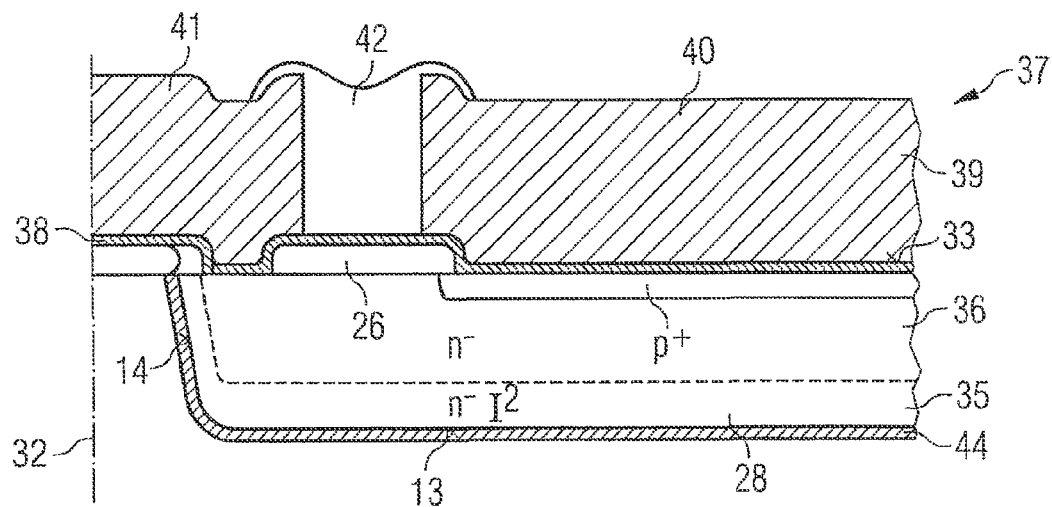
FIG. 5 illustrates the deposition of a seed layer on the highly doped layer.

In the embodiment illustrated in FIG. 5, a nickel seed layer 44 is deposited onto all of the exposed surfaces of the highly-doped n layer, in particular on the second side 13 and the side faces 14. This is carried out by pulsed electro-deposition by using the drain contact 41 as the cathode in the electrodeposition cell.

FIG. 5 also illustrates that a further sideways etch of the filed oxide 26 positioned in the singulation trench may be performed to remove the field oxide 26 in the region extending between the first face 12 and the drain contact 41. This further etch may be performed after or before the deposition of the nickel layer.

Figure 6:
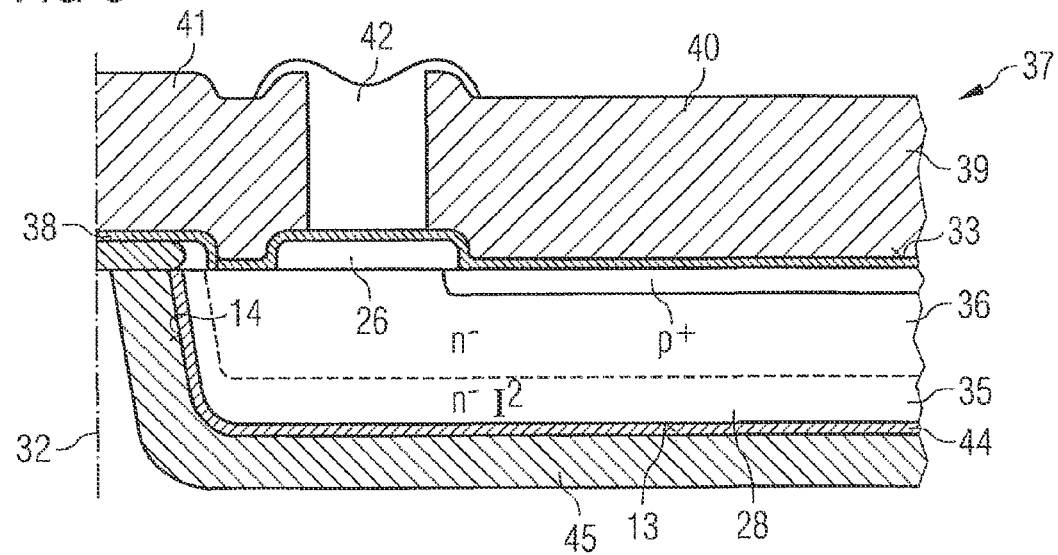
FIG. 6 illustrates the deposition of a metallization layer on the seed layer.

FIG. 6 illustrates the deposition of a thick copper layer 45 onto the nickel seed layer 44 by electro-deposition during which the drain contact 41 also provides the cathode of the electro-position cell. FIG. 6 illustrates that the layer 45 covers the second face 13 and side faces 14 and extends to, and is in direct contact with, the drain contact 41 arranged on the first major surface 33 of the wafer 30. The highly doped layer 35 of the semiconductor substrate is electrically connected to the drain contact 41 positioned on the first major surface 33 of the semiconductor wafer 30 by the layer 45.

FIG. 7 illustrates a larger view of the semiconductor wafer 30 in which three adjacent component positions 31 are illustrated after the method illustrated in FIGS. 2 to 6 has been carried out. A thin outer gold coating 46 may be deposited on the copper of the first metallization layer 37 and of the layer 45 as a finishing layer. The gold coating 46 may hinder the oxidation of the copper of the layer 45 and metallization 37. The electronic components 10 are singulated from the wafer 30 by sawing or by breaking the wafer along the singulation lines 32. The first major surface 33 provides the first face 12 of the singulated electronic components 10.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    providing a semiconductor substrate of a first conductivity type including a first major surface and a second major surface opposing the first major surface;
    forming a highly doped buried layer of a second conductivity type complementary to the first conductivity type in the semiconductor substrate; and
    performing an anodic etch and removing material of the first conductivity type from the second major surface to produce a semiconductor substrate with a generally planar second face, and side faces extending from the generally planar second face to the first major surface, wherein the anodic etch is performed to remove the material of the first conductivity type until the highly-doped buried layer is exposed to form the planar second face, wherein the highly-doped buried layer has a well-shaped form including a curved transition between a generally planar base and side faces, and wherein the highly-doped buried layer bounds a central region of the first conductivity type.

2. The method of claim 1, wherein the highly doped buried layer is introduced by proton implantation following by thermal annealing.

3. The method of claim 1, wherein the highly doped buried layer is introduced by implanting phosphor atoms into the semiconductor substrate.

4. The method of claim 1, further comprising depositing a metallic layer on the second face and the side faces.

5. The method of claim 4, wherein the metallic layer is deposited by electrodeposition.

6. The method of claim 1, further comprising arranging a metallization on the first major surface of the semiconductor substrate provides an electrode of an electrochemical cell used to deposit the metallic layer by electrodeposition.

7. The method of claim 1, further comprising arranging a metallization on the first major surface of the semiconductor substrate provides an electrode of an electrochemical cell used to perform the anodic etching.

8. The method of claim 1, further comprising depositing a metallic seed layer on the second face and side faces of the semiconductor substrate and a second metallic layer onto the metallic seed layer.

9. A method, comprising:
    providing a semiconductor substrate of a first conductivity type including a first major surface and a second major surface opposing the first major surface,
    forming a highly doped buried layer of a second conductivity type complementary to the first conductivity type in the semiconductor substrate,
    performing an anodic etch and removing material of the first conductivity type from the second major surface to produce a semiconductor substrate with a generally planar second face, side faces extending from the generally planar second face to the first major surface, and a curved contour extending from the generally planar second face to the side faces; and
    forming a peripheral layer of the first conductivity type extending along the second face and the side faces and bounding a central region of the first conductivity type, the peripheral layer being more highly doped than the central region.

10. The method of claim 9, further comprising:
    depositing a metallic layer on, and entirely covering, the second face, the curved contour and the side faces such that the metallic layer directly contacts the second face, the curved contour, and the side faces.

11. The method of claim 9, further comprising:
    depositing a metallic layer on the first major surface.

12. The method of claim 9, wherein the peripheral layer includes a first thickness adjacent the second face and a second thickness adjacent the side faces, the first thickness being greater than the second thickness.

13. The method of claim 9, wherein the curved contour is edgeless.

14. The method of claim 9, wherein the side faces flare outwardly from the second face.

15. A method for fabricating a vertical MOSFET device, comprising:
    providing a semiconductor substrate of a first conductivity type including a first major surface and a second major surface opposing the first major surface;
    forming a highly doped buried well-shaped layer of a second conductivity type complementary to the first conductivity type in the semiconductor substrate;
    performing an anodic etch and removing material of the first conductivity type from the second major surface to produce a semiconductor substrate with a generally planar second face, side faces extending from the generally planar second face to the first major surface, and a curved contour extending from the generally planar second face to the side faces;
    forming a source contact on the first major surface and having a first area;
    forming a gate contact on the first major surface and spaced apart and electrically isolated from the source contact, the gate contact having a second area smaller than the first area;
    forming a drain contact having a first portion on the first major surface and a second portion extending outwardly from the side faces, and
    forming a peripheral layer of the first conductivity type extending along the second face and the side faces and bounding a central region of the first conductivity type, the peripheral layer being more highly doped than the central region.

16. The method of claim 15, wherein forming the drain contact comprises forming a generally square ring-shaped drain contact arranged on the side faces of the semiconductor substrate.

\* \* \* \* \*